US009335868B2

(12) United States Patent
Hotelling et al.

(10) Patent No.: US 9,335,868 B2
(45) Date of Patent: May 10, 2016

(54) CAPACITIVE SENSOR BEHIND BLACK MASK

(75) Inventors: Steve Porter Hotelling, San Jose, CA (US); Jeffrey Traer Bernstein, San Francisco, CA (US); David T. Amm, Sunnyvale, CA (US); Omar S. Leung, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 2355 days.

(21) Appl. No.: 12/184,190

(22) Filed: Jul. 31, 2008

(65) Prior Publication Data

US 2010/0026656 A1 Feb. 4, 2010

(51) Int. Cl.
*G06F 3/044* (2006.01)
*H03K 17/955* (2006.01)
*H03K 17/96* (2006.01)

(52) U.S. Cl.
CPC .............. *G06F 3/044* (2013.01); *H03K 17/955* (2013.01); *H03K 17/962* (2013.01); *H03K 2217/960775* (2013.01)

(58) Field of Classification Search
CPC ..... G06F 3/044; G06F 3/0412; G06F 3/0416; G06F 2203/04101; G06F 2203/04108
USPC ......... 345/42, 156, 158, 173–179; 178/18.01, 178/18.03, 18.06
See application file for complete search history.

(56) References Cited

U.S. PATENT DOCUMENTS

| 5,224,151 A | * | 6/1993 | Bowen et al. | .............. 455/569.1 |
| 5,376,948 A | | 12/1994 | Roberts | |
| 5,483,261 A | | 1/1996 | Yasutake | |
| 5,488,204 A | | 1/1996 | Mead et al. | |

(Continued)

FOREIGN PATENT DOCUMENTS

| EP | 1 241 557 | 9/2002 |
| EP | 1 241 558 | 9/2002 |

(Continued)

OTHER PUBLICATIONS

International Search Report mailed Nov. 27, 2009, for PCT Application No. PCT/US2009/051874, Filed Jul. 27, 2009, three pages.

(Continued)

*Primary Examiner* — Koosha Sharifi-Tafreshi
(74) *Attorney, Agent, or Firm* — Morrison & Foerster LLP

(57) ABSTRACT

Devices having one or more sensors located outside a viewing area of a touch screen display are disclosed. The one or more sensors can be located behind an opaque mask area of the device; the opaque mask area extending between the sides of a housing of the device and viewing area of the touch screen display. In addition, the sensors located behind the mask can be separate from a touch sensor panel used to detect objects on or near the touch screen display, and can be used to enhance or provide additional functionality to the device. For example, a device having a sensor located outside the viewing area can be used to detect objects in proximity to a functional component incorporated in the device, such as an ear piece (i.e., speaker for outputting sound). The sensor can also output a signal indicating a level of detection which may be interpreted by a controller of the device as a level of proximity of an object to the functional component. In addition, the controller can initiate a variety of actions related to the functional component based on the output signal, such as adjusting the volume of the earpiece.

18 Claims, 7 Drawing Sheets

(56) References Cited

U.S. PATENT DOCUMENTS

| | | | |
|---|---|---|---|
| 5,598,527 A * | 1/1997 | Debrus et al. ............... | 345/173 |
| 5,766,493 A | 6/1998 | Shin | |
| 5,825,352 A | 10/1998 | Bisset et al. | |
| 5,835,079 A | 11/1998 | Shieh | |
| 5,880,411 A * | 3/1999 | Gillespie et al. ........... | 178/18.01 |
| 5,886,687 A * | 3/1999 | Gibson ....................... | 345/173 |
| 6,188,391 B1 | 2/2001 | Seely et al. | |
| 6,288,707 B1 | 9/2001 | Philipp | |
| 6,310,610 B1 | 10/2001 | Beaton et al. | |
| 6,323,846 B1 | 11/2001 | Westerman et al. | |
| 6,327,011 B2 | 12/2001 | Kim | |
| 6,661,410 B2 * | 12/2003 | Casebolt et al. ............. | 345/173 |
| 6,690,387 B2 | 2/2004 | Zimmerman et al. | |
| 6,853,850 B2 * | 2/2005 | Shim et al. ................. | 455/550.1 |
| 6,924,789 B2 | 8/2005 | Bick | |
| 7,013,228 B2 | 3/2006 | Ritt | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 2002/0158838 A1* | 10/2002 | Smith et al. ................. | 345/156 |
| 2003/0076306 A1* | 4/2003 | Zadesky et al. ............. | 345/173 |
| 2003/0085870 A1* | 5/2003 | Hinckley ..................... | 345/156 |
| 2004/0252109 A1 | 12/2004 | Trent, Jr. et al. | |
| 2005/0012723 A1* | 1/2005 | Pallakoff ..................... | 345/173 |
| 2005/0035955 A1* | 2/2005 | Carter et al. ................. | 345/175 |
| 2005/0146513 A1* | 7/2005 | Hill et al. .................... | 345/173 |
| 2005/0219228 A1 | 10/2005 | Alameh et al. | |
| 2005/0275637 A1* | 12/2005 | Hinckley et al. ............ | 345/173 |
| 2006/0026521 A1 | 2/2006 | Hotelling et al. | |
| 2006/0097991 A1* | 5/2006 | Hotelling et al. ............ | 345/173 |
| 2006/0109252 A1* | 5/2006 | Kolmykov-Zotov et al. . | 345/173 |
| 2006/0197753 A1 | 9/2006 | Hotelling | |
| 2006/0238517 A1* | 10/2006 | King et al. ................... | 345/173 |
| 2006/0244733 A1 | 11/2006 | Geaghan | |
| 2006/0267953 A1* | 11/2006 | Peterson et al. ............. | 345/173 |
| 2006/0284855 A1* | 12/2006 | Shintome ..................... | 345/173 |
| 2007/0046646 A1* | 3/2007 | Kwon et al. ................. | 345/173 |
| 2007/0075968 A1* | 4/2007 | Hall et al. .................... | 345/157 |
| 2008/0012835 A1* | 1/2008 | Rimon et al. ................ | 345/173 |
| 2008/0012838 A1* | 1/2008 | Rimon ......................... | 345/174 |
| 2008/0158172 A1 | 7/2008 | Hotelling et al. | |
| 2008/0278450 A1* | 11/2008 | Lashina ....................... | 345/173 |

FOREIGN PATENT DOCUMENTS

| | | |
|---|---|---|
| JP | 2000-163031 A | 6/2000 |
| JP | 2002-342033 A | 11/2002 |
| WO | WO-99/38149 A1 | 7/1999 |
| WO | WO-2010/014560 A1 | 2/2010 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Anonymous. (Apr. 13, 2004). Proximity Sensor Demo Kit, User Guide, Version 0.62—Preliminary, Integration Associates, Inc., 14 pages.

* cited by examiner

CAPACITIVE SENSOR BEHIND BLACK MASK

FIELD OF THE INVENTION

This relates generally to input mechanisms, and more particularly, to touch-sensitive displays having sensors located outside a viewing area of the touch-sensitive display.

BACKGROUND OF THE INVENTION

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material such as Indium Tim Oxide (ITO), often arranged in rows and columns in horizontal and vertical directions on a substantially transparent substrate. In some touch sensor panel designs, the substantially transparent drive lines can be routed to one edge of the substrate for off-board connections using conductive (e.g. metal) traces in the border areas of the substrate where transparency is not required. An opaque mask printed on an interior of a top cover of the touch screen can extend between the viewing area of the touch screen and the sides of housing of the device. The mask can serve to cover the border areas so that the connections of the touch panel are not viewable. However, the area of a device covered by the mask lacks additional functionality.

SUMMARY OF THE INVENTION

Various embodiments of the present invention relate to devices having one or more sensors located outside a viewing area of a touch screen display. For example, the one or more sensors may be located behind an opaque mask area of a device; the opaque mask area extending between the sides of a housing of the device and viewing area of the touch screen display. In addition, the sensors located behind the mask can be separate from a touch sensor panel used to detect objects on or near the touch screen display, and can be used to enhance or provide additional functionality to the device. For example, a device having a sensor located outside the viewing area can be used to detect objects in proximity to a functional component incorporated in the device, such as an ear piece (i.e., speaker for outputting sound). The sensor can also output a signal indicating a level of detection which may be interpreted by a controller of the device as a level of proximity of an object to the functional component. In addition, the controller can initiate a variety of actions related to the functional component based on the output signal, such as adjusting the volume of the earpiece.

DETAILED DESCRIPTION OF THE PREFERRED EMBODIMENTS

In the following description of preferred embodiments, reference is made to the accompanying drawings in which it is shown by way of illustration specific embodiments in which the invention can be practiced. It is to be understood that other embodiments can be used and structural changes can be made without departing from the scope of the embodiments of this invention.

This relates to a device having one or more sensors located outside a viewing area of a touch screen display. For example, the one or more sensors may be located behind an opaque mask area of the device; the opaque mask area extending between the sides of a housing of the device and viewing area of the touch screen display. In addition, the sensors located behind the mask can be separate from a touch sensor panel used to detect objects on or near the touch screen display, and can be used to enhance or provide additional functionality to the device. For example, a device having a sensor located outside the viewing area can be used to detect objects in proximity to a functional component incorporated in the device, such as an ear piece (i.e., speaker for outputting sound). The sensor can also output a signal indicating a level of detection which may be interpreted by a controller of the device as a level of proximity of an object to the functional component. In addition, the controller can initiate a variety of actions related to the functional component based on the output signal, such as adjusting the volume of the earpiece.

Although embodiments of the invention may be described and illustrated herein in terms of mutual capacitance touch sensor panels, it should be understood that embodiments of this invention are not so limited, but are additionally applicable to self-capacitance sensor panels, and both single and multi-touch sensor panels in which the fabrication of conductive traces is required. Furthermore, although embodiments of the invention may be described and illustrated herein in terms of double-sided ITO (DITO) touch sensor panels, it should be understood that embodiments of the invention are also applicable to other touch sensor panel configurations, such as configurations in which the drive and sense lines are formed on different substrates or on the back of a cover glass, and configurations in which the drive and sense lines are formed on the same side of a single substrate.

Figure 1:
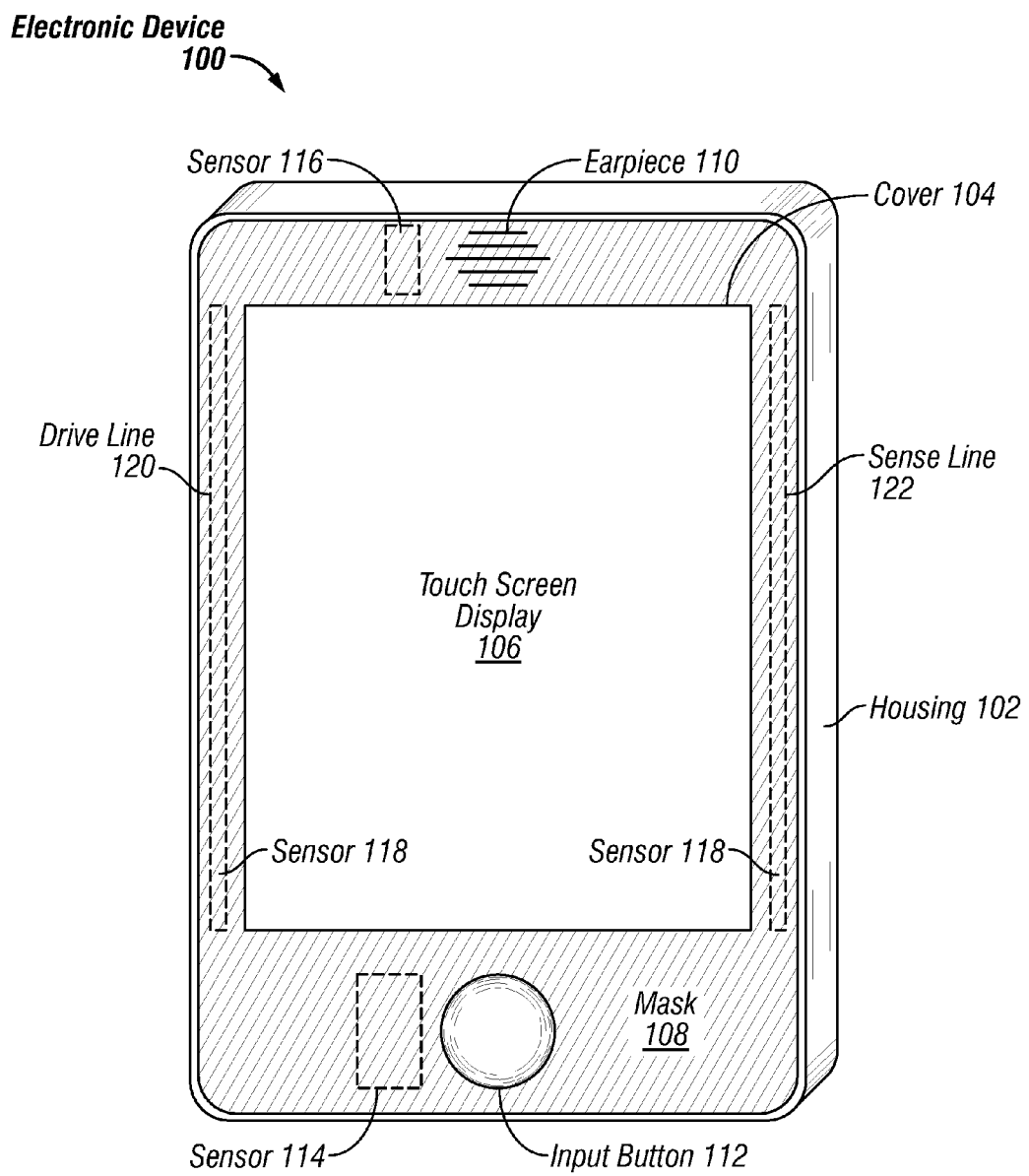
FIG. 1 is a perspective view of an electronic device having a touch screen display and a plurality of sensors located outside a viewing area of the device according to embodiments of the invention.

FIG. 1 illustrates an exemplary device 100 according to various embodiments of the invention. In this example, the device 100 includes a housing 102 and a cover 104 fabricated from a rigid material such as glass, for example. The cover 104 has a touch screen display 106 and a mask 108 extending between the touch screen display and sides of the housing 100. Examples of the device 100 can include mobile telephones, portable music players, personal digital assistants (PDAs), tablet computers and other handheld computing devices.

Touch screen display 106 can include a viewing area for viewing a display 224 (shown in FIG. 2a) disposed under the cover 104 and within the housing 100. The display 224 can be, for example, an LCD display. The display 224 can be configured to display a graphical user interface (GUI) including perhaps a pointer or cursor as well as other information to a user. The touch screen display 106 can also be touch sensitive and, in various embodiments, can be operable to detect touch events on or near the touch screen display 106 at about the same time. Based on the detected events, device 100 can perform one or more actions, such as moving a pointer or cursor or making a selection. Thus, touch screen display can allow a user to interact with the GUI.

Device 100 can also include additional input and output components (also referred to herein collectively as "functional components"). For example, device 100 can include an earpiece 110 for outputting sound and a mechanical input button 112 for receiving input from a user (e.g., by a user pressing the input button). The mechanical input button 112 can extend through a hole in the cover 102. It is understood that these functional components are merely exemplary and device 100 need not use these functional components nor be limited to using these particular functional components, as other functional components can also be included or used in place of the above-described functional components.

The device 100 can also include one or more sensors operable to detect objects through the mask 108. The sensors can be widely varied. For example, in the embodiment illustrated in FIG. 1, device 100 can have a first capacitive sensor 114 located behind the mask 108 and near the input button 112, a second capacitive sensor 116 located behind the mask 108 and near the earpiece 110, and a third capacitive sensor 118 having a drive line 120 located behind the mask 108 and adjacent to one side of the touch screen display 106 and a sense line 122 located behind the mask 108 and adjacent to the other side of the touch screen display 106. Some or all of the sensors may be optical sensors or other types of sensors. Exemplary capacitive and optical (infrared) sensors capable of being used with embodiments of the invention are disclosed in U.S. application Ser. No. 11/694,998 entitled "Proximity and Multi-Touch Sensor Detection and Demodulation," filed on Jan. 3, 2007, the contents of which are incorporated by reference herein in their entirety for all purposes.

The locations of sensors operable to detect objects through the mask can also vary. For example, the sensor 118 is illustrated in FIG. 1 as being a capacitive sensor having drive line 120 and sense line 122 located on opposite sides of the touch screen area 106. In other embodiments, the drive line 120 and sense line 122 can both be located on one side of the touch screen display 106; for example, drive and sense lines can both be located behind a lower portion of the mask 108 near the input button 112. In a further embodiment, either the drive line 120 or sense line 122 can be located under an upper portion of the mask (e.g., near the earpiece 110) and the other line can be located under a lower portion of the mask 108 (e.g., near the input button).

Moreover, additional sensors can be added to other locations behind the mask 108. For example, in one embodiment, device 100 can further include a sensor having either a drive line or sense line located behind the mask 108 adjacent to a top portion of the touch screen display 106 and the other line located behind the mask 108 adjacent to a lower portion of the touch screen display 106.

In capacitive sensing embodiments, sensors 114, 116 and 118 can be based on either self capacitance or mutual capacitance. In self capacitance, the "self" capacitance of a single electrode can be measured as for example relative to ground. In mutual capacitance, the mutual capacitance between at least the first and second electrodes of a particular sensor is measured. In either case, each sensor can work independent of the other sensors to produce separately occurring signals representative of one or more objects in proximity to the corresponding sensor. In the embodiment illustrated in FIG. 1, sensors 114 and 116 can be based on self capacitance and sensor 118 can be based on mutual capacitance. Exemplary self capacitance sensors are disclosed in U.S. patent application Ser. No. 10/840,862 entitled "Multipoint Touchscreen," filed on May 6, 2004, the contents of which are incorporated by reference herein in their entirety for all purposes.

Figure 2A:
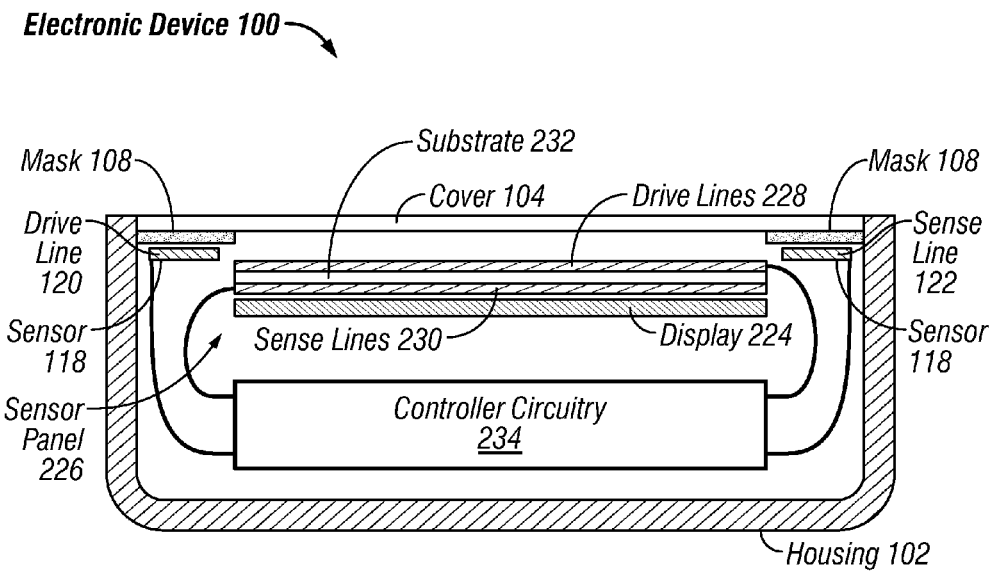
FIG. 2a is a cross-sectional view of the electronic device of FIG. 1 according to embodiments of the invention.

FIG. 2a illustrates a cross-sectional view of exemplary device 100. Device 100 includes housing 102 with cover 104 positioned between sides of the housing 102. A display 224 can be positioned within the housing and a touch sensor panel 226 can be positioned between the cover 104 and the display 224, although in other embodiments the touch sensor panel can be partially or fully incorporated within the display. The touch sensor panel 226 can include one or more sensing layers configured for either mutual or self capacitance. The sensing layers generally include a plurality of interconnects at the edge of the sensor panel for coupling the sensing layers to controller circuitry 234. Control circuitry 234 can include various integrated circuit chips and other circuitry that provide computing operations for the device 100. In accordance with various embodiments, control circuitry 234 can be coupled to sensor panel 234 and sensors 114, 116 and 118, and can include drive and detection circuitry to obtain output from sensor panel 234, sensors 114, 116 and 118.

As shown in FIG. 2a, the display 224 and touch sensor panel 226 are disposed within the housing 102 and under the cover 104. The housing 102 and cover 104 can serve to cover and support these components in their assembled position within the device 100. The housing 102 can provide a space for placing the display 224 and touch sensor panel 226 as well as an opening so that the display 224 can be inserted into the housing 102 when being constructed. The cover 104 can serve to protect the touch sensor panel 226 and display 224 and control circuitry 234.

In accordance with various embodiments, touch sensor panel 226 can detect touch events on the surface of the touch screen display 106 and thereafter output information relating to the touch events to control circuitry 234. The control circuitry 234 can thereafter interpret the touch event information and perform an action based on the touch events. In accordance with various embodiments, touch sensor panel 226 can be configured to recognize multiple touch events that occur at different locations on the surface to the touch screen display 106 at substantially the same time. That is, the touch screen display 106 allows for multiple contacts points to be tracked simultaneously, i.e., if four objects are touching the area touch screen display 106, the touch sensor panel 226 tracks all four objects. Further details regarding systems and methods capable of recognizing multiple touch events at different locations on a touch sensitive surface at the same time are described U.S. patent application Ser. No. 10/840,862 filed on May 6, 2004 and titled "Multipoint Touchscreen", the content of which is incorporated herein by reference in its entirety.

In accordance with various embodiments, the touch sensor panel 226 is based on mutual capacitance sensing and, thus, the sensing layer includes driving lines 228 and sensing lines 230. The driving lines 228 can be disposed on the top of a transparent substrate 232, and the sensing lines 230 can be disposed on the bottom of the substrate. The substrate 232 can serve to insulate the driving lines 228 and the sensing lines 230 from one another. The substrate 232 can be, for example, a clear piece of plastic with optical matching materials retained therein or applied thereto.

With further reference to FIGS. 1 and 2a, mask 108 can be printed on an interior portion of the cover 104 that extends between touch screen display 106 and the sides of the housing 102. In one embodiment, the mask 108 is formed from high temperature black polymer. The mask 108 can serve to cover interconnects extending from sides of the of the touch sensor panel 226.

FIG. 2a also illustrates capacitive sensor 118 positioned behind the mask 108. As shown, drive line 120 and sense line 122 of capacitive sensor 118 are positioned behind the mask 108 on opposite sides of the touch screen display 106. In operation, field lines can extend between drive line 120 and sense line 122 through the cover 102 and over the touch screen display 106.

Figure 2B:
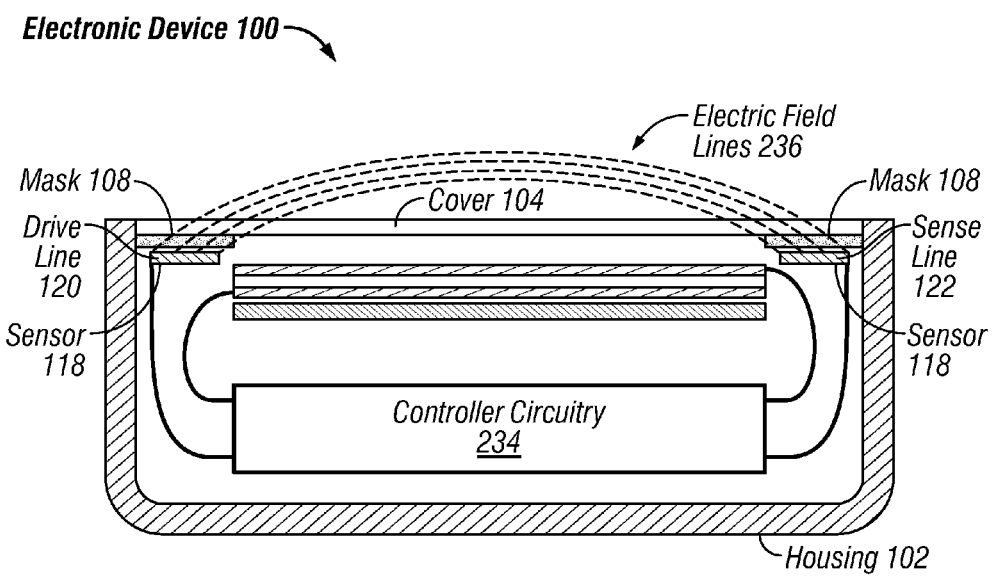
FIG. 2b is a cross-sectional view of the electronic device of FIG. 1 illustrating electric field lines extending across the touch screen display according to embodiments of the invention.

FIG. 2b is an exemplary illustration of device 100 with electric field lines 236 extending between drive line 120 and sense line 122 of capacitive sensor 118. As illustrated, the electric field lines 236 extend over the touch screen display 106 in an arcing fashion. The arcing properties of the field lines can serve to detect an object further out than just in close proximity to the touch screen display, for example. The presence of an object located relatively far or in relatively close proximity to the touch screen display 106 can therefore be determined by detecting the strength of the field lines 236 or changes in the strength of the field lines 236. For example, an object placed in the path of the field lines can shunt or block some of the field lines, resulting in a reduced strength of the signal generated by the sensor.

In addition, it should be understood that the level of signal strength generated by a capacitive sensor can be interpreted as a level of proximity (e.g., how close or far an object is located from a particular area). In other words, as an object moves further into the electric field of the sensor, the object blocks more and more of the electric field lines. Thus, the strength of the signal from the sensor can be variable and representative of how close an object is to a particular area. As an example, a controller receiving the signal from the sensor can compare the strength of the signal to thresholds defining various detection conditions. In this manner, a signal that is determined to be greater than a first, high-end threshold, can indicate that an object is not within the electric field lines extending from the sensor. This can be referred to as a "no-touch" event since this can indicate that no object is detected in proximity to a particular area associated with the sensor. A signal strength that is determined to be between the first, high-end threshold and a second, low-end threshold can indicate that an object is within the electric field lines, but not touching a particular area of the device 100 (e.g., not touching the display screen area 106), which can be referred to as a "hover" event. In addition, a signal strength that is determined to be less than the low-end threshold can indicate that an object is on or at least very close to the particular area, which can be referred to as a "touch" event. Depending upon the condition, different actions can be performed by device 100.

Figure 2C:
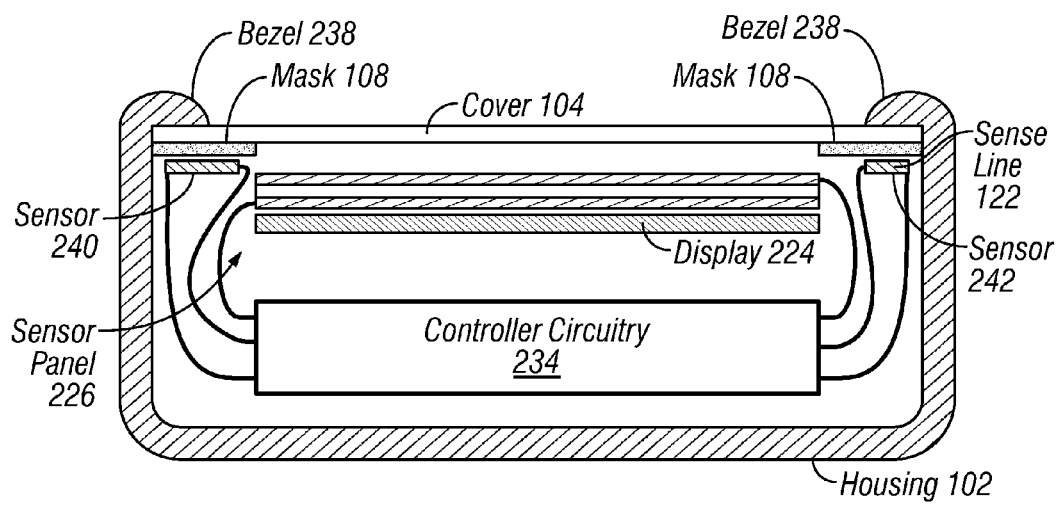
FIG. 2c is a cross-sectional view of the electric device of FIG. 1 illustrating sensors located behind a bezel of the housing according to various embodiments of the invention.

It can be noted that sensors located outside the viewing area of device 100 need not be limited to being located behind mask 108. For example, sensors can be located under portions of the housing 102 in accordance with various embodiments. With reference to FIG. 2c, housing 102 can include a bezel 238 that surrounds the edges of the cover at a front surface of the housing 102. FIG. 2c also illustrates that sensors 240 and 242, which can be identical or similar to one of sensors 114, 116 and/or 118, can be placed entirely or partially behind the bezel 238 of the housing. In this manner, sensors 240 and 242 can then detect through the bezel 238 portion of the housing 102 and/or the cover 104.

As discussed above, one of a plurality of actions can be taken in response to one or more of the sensors 114, 116, and 118 detecting an object or a lack of an object in proximity to the a functional component. For example, with reference to FIG. 1, sensor 116 is located near earpiece 110 and can therefore detect an object in proximity the earpiece 110. Similarly, sensor 114 can detect an object in proximity to the input button 112 and sensor 120 can sense an object in proximity to the touch screen display 106. In response to one of the sensors 114, 116, 118 detecting an object or a lack of an object, device 100 can perform one of a plurality of actions.

In accordance with various embodiments, the actions taken in response to sensor 114, 116 or 118 detecting an object or a lack of an object can relate to the functionality or aspect of a component associated with the sensor. In most cases, the component can be located in proximity to the field lines emanating from the associated sensor.

As an example, with reference to FIG. 1, device 100 can perform an action related to earpiece 110 when sensor 116 detects an object in proximity to earpiece 110. Such an action can include turning on earpiece 110 or adjusting a volume control of earpiece 110. In addition, device 100 can perform an action when sensor 116 does not detect an object in proximity to the earpiece 110, such as turning off the earpiece or adjusting the volume control of earpiece 110.

As another example, device 100 can perform an action related to input button 112 when an object is detected in proximity to sensor 114, such as activating input button 112 so that the input button is placed in a state capable of detecting user input, such as from a user pressing the input button 112. In addition, device 100 can perform an action when an object is not detected in proximity to the input button 112, such as disabling the input button. In this manner, device 100 can determine that a user is not pressing the input button 112 when sensor 114 does not detect an object in proximity to the input button. Thus, device 100 can recognize that input button 112 is stuck or has failed to return completely to its original position after being pressed, for example, if the input button 112 indicates a pressed condition yet sensor 114 does not detect an object in proximity to the input button 112.

As yet another example, device 100 can perform an action related to touch screen display 106 when sensor 120 detects an object in proximity to the touch screen area 106. As used herein, the term "action" can refer to any function or process performed by a computer system in response to user input. Moreover, an action need not be a function traditionally initiated by a user using conventional input devices, such as keyboards, touch pads, trackballs, mice and the like. A few non-limiting examples of an action can include moving a cursor displayed on a graphical user interface, making a selection indication (e.g., similar to depressing a selection button on a mouse, for example), changing a mode of operation, turning volume up or down, changing channels, paging back and forth in a software application, initiating a startup or wakeup sequence of various components of device 100, and increasing a data collection rate to decrease lag.

In accordance with one embodiment, device 100 performs an action that includes waking up components used to detect touch events on sensor panel 226 when sensor 120 detects an object in proximity to the touch screen display 106. By doing so, device 100 can conserve power by placing the components used to detect touch events on sensor panel 226 in a sleep mode during periods of inactivity (e.g., no touches are detected on touch sensor panel 226 after a predetermined period of time), and wake up those components prior to a possible touch-event occurring on the touch screen 106.

In accordance with various embodiments, the sensor 118 can include a plurality of drive and sense nodes located outside a viewing area of the device 100. In this manner, control circuitry 234 can interpret the signals generated by the drive and sense nodes to determine a multi-dimensional position (e.g., positions in x, y and/or z dimensions) of an object relative to the touch screen display 106, for example.

Figure 3:
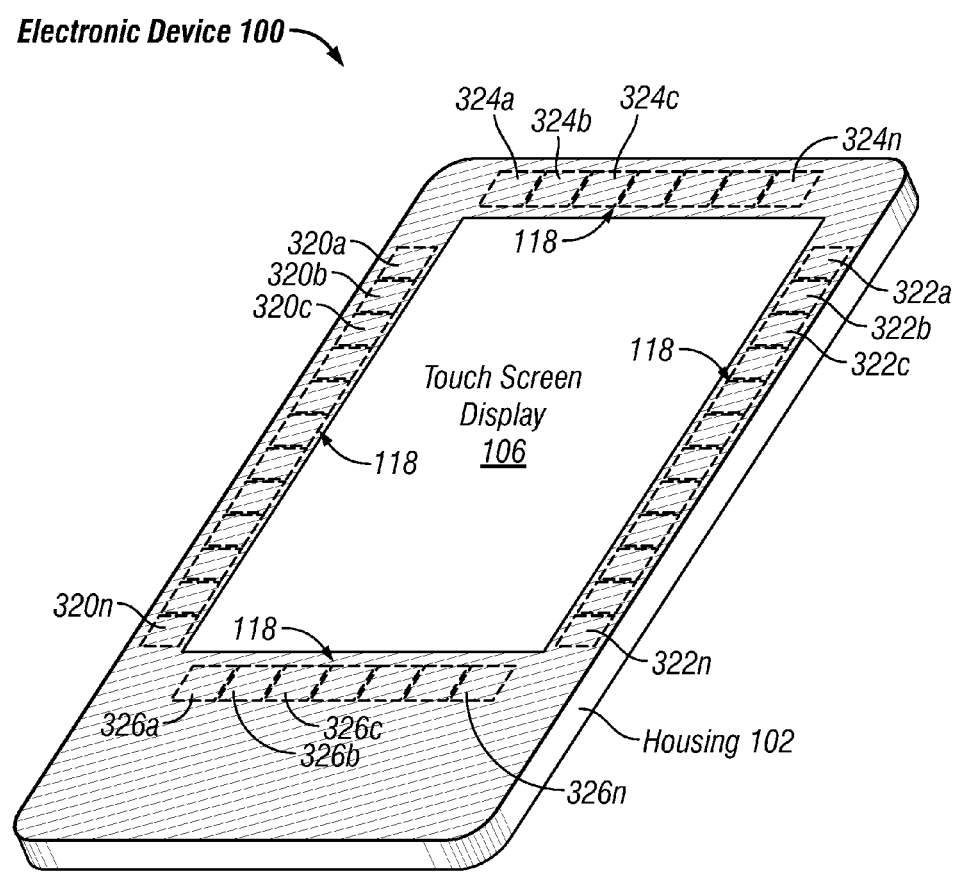
FIG. 3 is a perspective view of an exemplary electronic device illustrating a sensor having a plurality of sensing nodes located outside a viewing area of the electronic device in accordance with various embodiments of the invention.

FIG. 3 illustrates an exemplary configuration of device 100 having a plurality of drive nodes and sense nodes located outside a viewing area of the electronic device in accordance with various embodiments. As illustrated, sensor 118 includes a first plurality of drive nodes 320a, 320b, 320c . . . 320n located adjacent to a first side of the touch screen display and corresponding second plurality of sense nodes 322a, 32b, 322c . . . 322n located adjacent to a second, opposite side of the touch screen display. Furthermore, a second plurality of drive nodes 324a, 324b, 324c . . . 324n can be located adjacent to a third side of the touch screen display 106 and corresponding second plurality of sense nodes 326a, 326b, 326c . . . 326n can be located on adjacent to a fourth side of the touch screen display.

As used herein, "adjacent to the touch screen display" refers to near the touch screen display, but between the touch screen display 106 and the housing 102. In accordance with various embodiments, sensors or sensor nodes located "adjacent to the touch screen display" can include sensors or sensor nodes behind the mask illustrated 108 in FIGS. 1 and 2.

In operation, sensor 118 can detect multiple objects in proximity to the touch screen 106 occurring at about the same time, and identify and track their locations. The operation of sensor 118 can be similar to that of operation of the sensor panel 226, wherein the drive nodes 320 and 324 correspond to drive lines 228 and the sense nodes 322 and 326 correspond to the sense lines 230. Further details regarding a sensor having drive lines and sense lines capable of detecting multiple objects as about the same time are described U.S. patent application Ser. No. 10/840,862 filed on May 6, 2004 and titled "Multipoint Touchscreen", the content of which are incorporated herein by reference in its entirety. Thus, when drive node 320a, for example, is driven by a stimulation frequency, a capacitance can appear between the drive node 320a and its corresponding sense node 322a. Controller circuitry 234 can then detect a capacitive strength between the nodes 320a and 322a. The remaining drive nodes 320 and 324 and corresponding sense nodes 322 and 324 can operate in the same or similar fashion so that a capacitive strength is measured between each pair of drive and sense nodes. Using the relative capacitive strengths between each pair of nodes, controller circuitry 234 can determine locations of objects in proximity to the touch screen display 106. Moreover, various multiplexing techniques can be used so that controller circuitry 234 can differentiate signals between each pair of drive and sense nodes.

Accordingly, use of touch sensor panel 226 along with one or more sensors located behind mask 108, such as sensors 114, 116 and 118, can provide additional detection and operational capabilities not available with the sensor panel by itself. For example, in accordance with various embodiments, although only the actual touch of an object upon the touch screen display 106 can be detected by touch sensor panel 226, the mere hovering of an object above the surface can be detected by sensor 118. The detection of a hovering object can enable device 100 to perform certain functions that are preferentially triggered by hovering as opposed to touch. Detection of a hovering object can be referred to herein as a "hover event." Moreover, detection of an object on or substantially on a surface of the device, such as the surface of the touch screen display 106, can be referred to herein as a "touch event".

In accordance with various embodiments, the sensors 114, 116 and 118 can be configured to independently detect a touch event or hover event and to send this information to the controller 234. In some cases, the sensors 114, 116 and 118 can recognize a position and magnitude of a touch event or hover on or in proximity to a functional component. The sensors 114, 116 and 118 can report the touch event or hover event to the controller 234 and the controller 234 can interpret the touch event or hover event in accordance with its programming. For example, the controller 234 can initiate an action in accordance with a particular touch event or hover event.

Substantially concurrent use of touch sensor panel 226 along with one or more sensors 114, 116 and 118 can be performed using various multiplexing techniques in accordance with various embodiments. For example, touch sensor panel 226 and sensor 118 can be time multiplexed by driving and sensing each sensor at different times. As another example, the sensors can be frequency multiplexed so that signals having different frequencies are used to stimulate the various sensors. In this manner, controller circuitry 234 can filter out frequencies not used by a particular sensor.

In addition, due to a relatively large distance between corresponding drive lines 120 (or drive nodes 320 and 324) and sense lines 122 (or sense nodes 322 and 326), sensor 118 may need to be operated with different stimulation voltages and frequencies, and use different stimulation and integration times than sensors that do not have such distances between corresponding drive and sense lines or nodes. For example, in accordance with some embodiments, sensor 118 can be operated at higher stimulation voltages and at different frequencies than sensors 114 and 116, as well as sensor panel 226. In addition, sensor 118 can be operated with a longer stimulation time (i.e. drive lines are stimulated for a loner time period) and integration time (i.e. longer time period for receiving signals from the sense lines). Using longer stimulation and integration times can reduce the effects of certain types of noise and can improve detection of small variations in capacitance, since an object placed in proximity to a sensor having a relatively large distances between drive line and sense line typically results in a smaller change in capacitance between the lines than if the lines were closer together.

Furthermore, touch sensor panel 226 along with one or more of sensors 114, 116 and 118 need not be used at the same time. For example, sensor 118 can be active so as to constantly or periodically detect for an object in the proximity of the touch screen display 106. Should an object not be detected (e.g., a "no touch condition" exists), then sensor panel 226, display 224 and/or other components of device 100 can be in put in or kept in a sleep or powered down mode so as to conserve power. However, should an object be detected in the proximity of the touch screen display 106 by sensor 118, thereby indicating potential use of device 100, for example, then the touch sensor panel 226, display 224 and/or other components previously in the sleep mode can be awakened (i.e. activated).

Although the capacitive sensors 114, 116 and 118 are described herein as being located behind the mask 108, the sensors need not be located behind the mask 108. Instead, sensors can be located behind the cover 104, outside a viewing area of the touch screen display 106. The viewing area can be considered as an area of the cover 104 through which a user views the display 224, for example.

Figure 4:
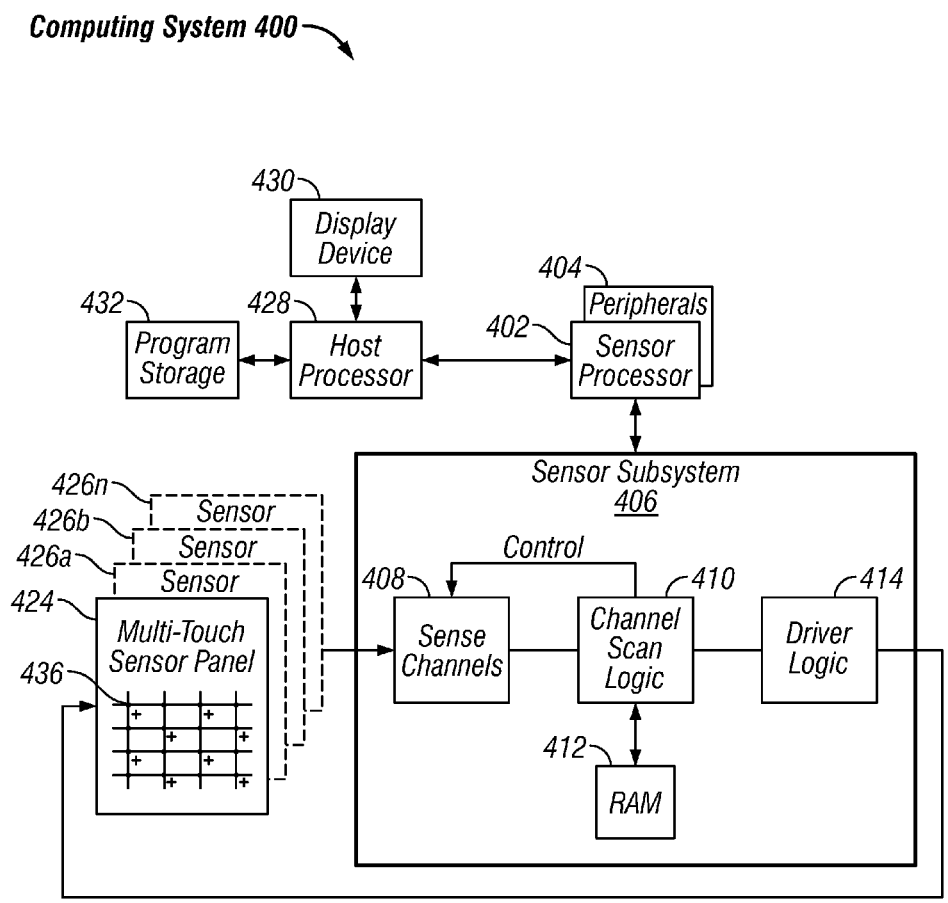
FIG. 4 illustrates an exemplary computing system including a touch sensor panel and a plurality of separate sensors according to embodiments of the invention

FIG. 4 illustrates exemplary computing system 400 that can include one or more of the embodiments of the invention described above. Computing system 400 can include one or more sensor processors 402 and peripherals 404, and sensor subsystem 406. Peripherals 404 can include, but are not limited to, random access memory (RAM) or other types of memory or storage, watchdog timers and the like. Sensor subsystem 406 can include, but is not limited to, one or more sense channels 408, channel scan logic 410 and driver logic 414. Channel scan logic 410 can access RAM 412, autonomously read data from the sense channels and provide control for the sense channels. In addition, channel scan logic 410 can control driver logic 414 to generate stimulation signals 416 at various frequencies and phases that can be selectively applied to drive lines of touch sensor panel 424 and sensors 426*a*, 426*b* . . . 426*n*. In this manner, computing system can multiplex sensor panel 424 and sensors 426*a*, 426*b* . . . 426*n*. In some embodiments, sensor subsystem 406, sensor processor 402 and peripherals 404 can be integrated into a single application specific integrated circuit (ASIC).

Touch sensor panel 424 and sensors 426*a*, 426*b* . . . 426*n* can include a capacitive sensing medium having a plurality of drive lines and a plurality of sense lines, although other sensing media can also be used. Each intersection of drive and sense lines can represent a capacitive sensing node and can be viewed as picture element (pixel) 436, which can be particularly useful when touch sensor panel 424 and sensors 426*a*, 426*b* . . . 426*n* are viewed as capturing an "image" of touch. (In other words, after sensor subsystem 406 has determined whether a touch event has been detected at each touch sensor in the touch sensor panel or sensors 426*a*, 426*b* . . . 426*n*, the pattern of touch sensors in the multi-touch panel or sensors 426*a*, 426*b* . . . 426*n* at which a touch event occurred can be viewed as an "image" of touch (e.g. a pattern of fingers touching the panel).) Each sense line of touch sensor panel 424 and sensors 426*a*, 426*b* . . . 426*n* can drive sense channel 408 (also referred to herein as an event detection and demodulation circuit) in sensor subsystem 406.

Computing system 400 can also include host processor 428 for receiving outputs from sensor processor 402 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, waking one or more components of the system from a sleep or powered down mode and/or the like. Host processor 428 can also perform additional functions that may not be related to touch panel or sensor processing, and can be coupled to program storage 432 and display device 430 such as an LCD display for providing a UI to a user of the device. Display device 430 together with touch sensor panel 424, when located partially or entirely under the touch sensor panel, can form touch screen 418.

Note that one or more of the functions described above can be performed by firmware stored in memory (e.g. one of the peripherals 404 in FIG. 4) and executed by panel processor 402, or stored in program storage 432 and executed by host processor 428. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 5A:
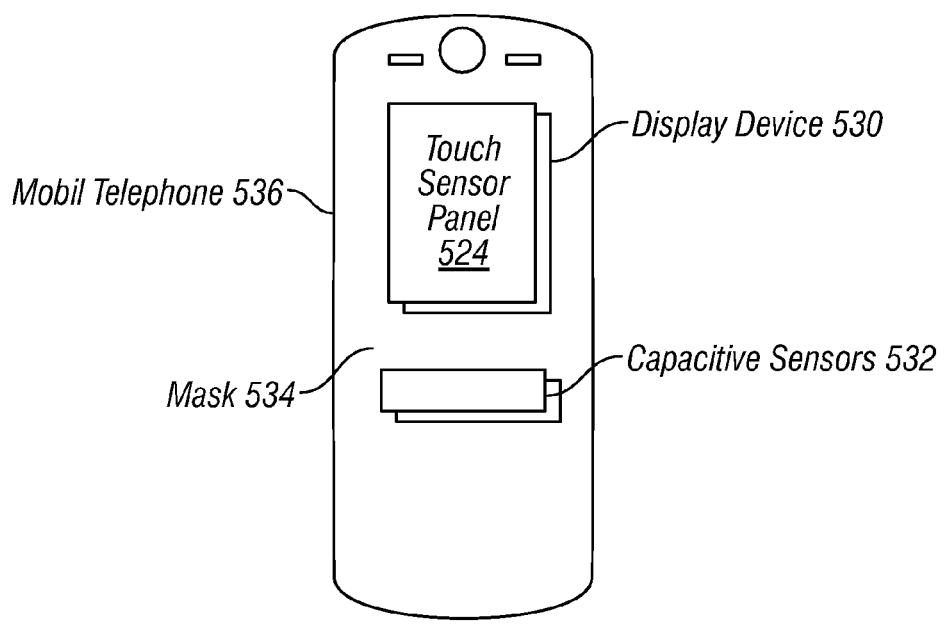
FIG. 5a illustrates an exemplary mobile telephone having a touch sensor panel and a plurality of separate sensors according to embodiments of the invention.

FIG. 5*a* illustrates exemplary mobile telephone 536 that can include a touch sensor panel 524, display device 530 and one or more sensors 532 located outside a viewing area of the display device (e.g., behind a mask region 534) according to embodiments of the invention.

Figure 5B:
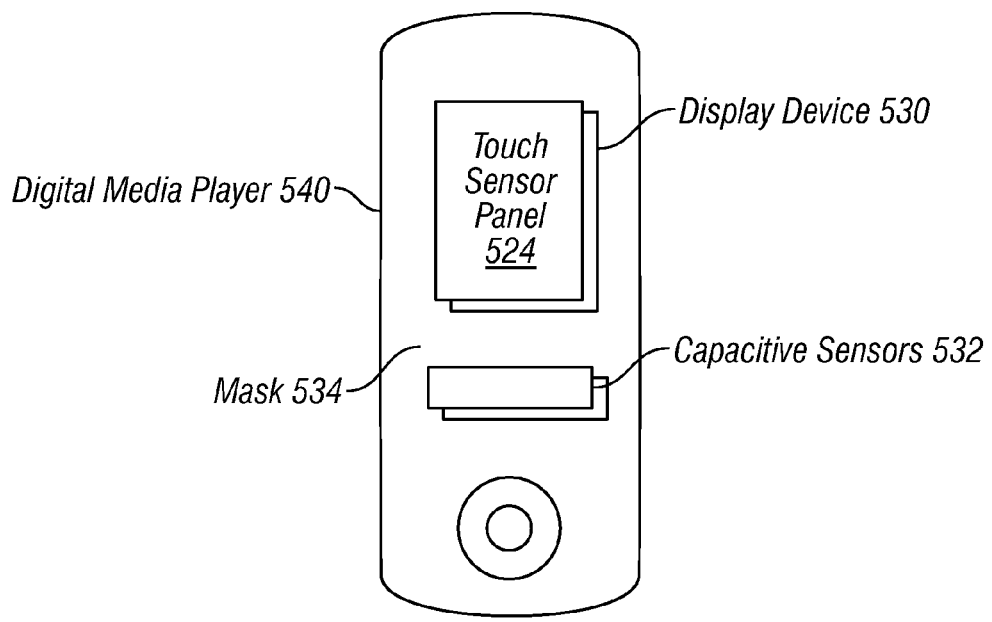
FIG. 5b illustrates an exemplary digital media player having a touch sensor panel and a plurality of separate sensors according to embodiments of the invention.

FIG. 5*b* illustrates exemplary digital media player 540 that can include a touch sensor panel 524, display device 530 and one or more sensors 532 located outside a viewing area of the display device (e.g., behind a mask region 534) according to embodiments of the invention.

Figure 5C:
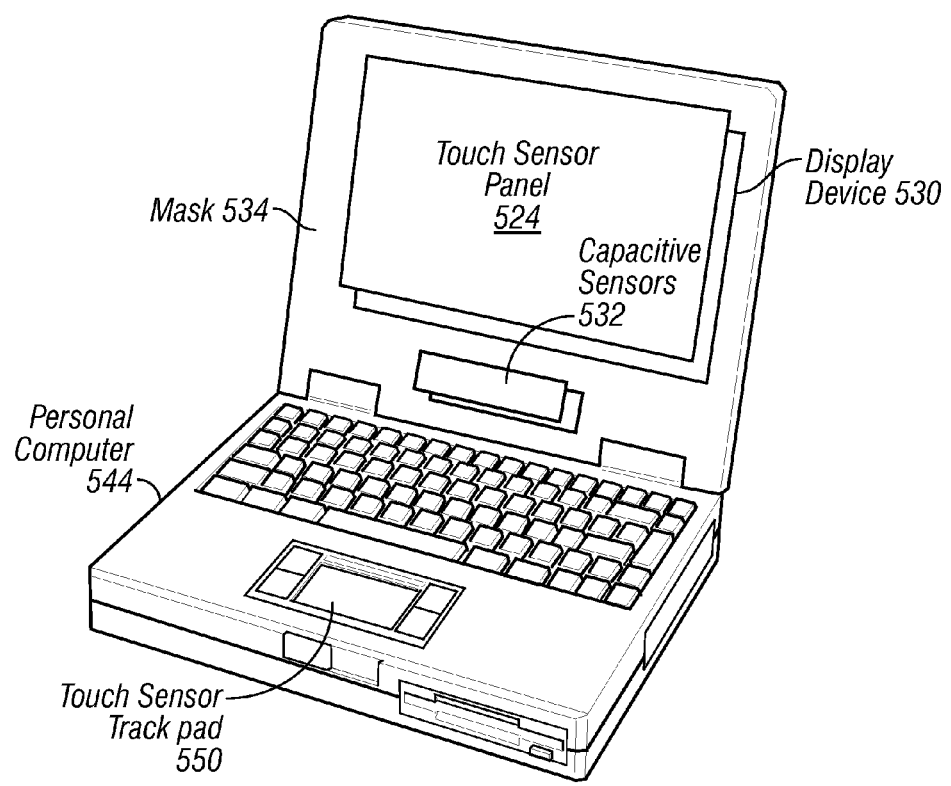
FIG. 5c illustrates an exemplary personal computer having a touch sensor panel and a plurality of separate sensors according to embodiments of the invention.

FIG. 5*c* illustrates exemplary personal computer 544 that can include a touch sensor trackpad 550, a touch sensor panel, a display device 530 and one or more sensors 532 located outside a viewing area of the display device (e.g., behind a mask region 534) according to embodiments of the invention.

The mobile telephone, media player and personal computer of FIGS. 5a, 5b and 5c can achieve improved overall functionality by utilizing the sensors located outside the viewing area of the display according to embodiments of the invention.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. An electronic device comprising:
a touch screen display configured to display a graphical user interface, the touch screen display having a sensor array operable to recognize touch events and produce signals representative of locations of the touch events on the display; and
a capacitive sensor located separate from and outside a viewing area of the display, the capacitive sensor comprising a sense electrode and a driver electrode located on opposite sides of the viewing area, the capacitive sensor operable to recognize a touch or hover event that occurs over the viewing area and produce a signal representative of the touch or hover event.

2. The electronic device of claim 1, wherein the capacitive sensor is associated with a functional component.

3. The electronic device of claim 2, further comprising control circuitry coupled to the capacitive sensor, the control circuitry adapted to receive the signal representative of the touch or hover event and operable to initiate one of a plurality of actions associated with the functional component based on the signal representative of the touch or hover event.

4. The electronic device of claim 1, wherein the capacitive sensor is a mutual capacitance sensor.

5. The electronic device of claim 1, wherein the sensor array is incorporated into a touch sensor panel.

6. The electronic device of claim 1, wherein the capacitive sensor comprises a plurality of drive nodes and a plurality of sense nodes.

7. The electronic device of claim 1, further comprising a computing system that incorporates the electronic device, the computing system comprising:
a sensor subsystem couplable to the sensor array and capacitive sensor;
a sensor processor coupled to the sensor subsystem; and
a host processor coupled to the sensor processor.

8. The electronic device of claim 7, further comprising a mobile telephone that incorporates the computing system.

9. The electronic device of claim 7, further comprising a digital audio player that incorporates the computing system.

10. A method for sensing touch and hover events on or about an electronic device having a touch screen, comprising:
generating one or more first signals by a touch sensor panel, the one or more signals by the touch sensor panel indicative of touch events occurring at distinct locations on a display area of the electronic device; and
generating one or more second signals by a capacitive sensor located outside the display area, the capacitive sensor comprising a sense electrode and a driver electrode located on opposite sides of the display area, the capacitive sensor, the one or more second signals generated by the capacitive sensor indicative of a touch or hover event occurring in proximity to a functional component of the electronic device; and
processing the one or more signals to enhance the functionality of the touch screen.

11. The method of claim 10, wherein the capacitive sensor comprises a sensor array.

12. The method of claim 10, further comprising performing an action based on the one or more signals generated by the capacitive sensor.

13. The method of claim 12, wherein performing the action comprises waking up touch screen circuitry operable to drive the touch panel sensor.

14. The method of claim 12, wherein performing the action comprises powering up a display operable to display a graphical user interface on the touch screen.

15. The method of claim 10, further comprising driving a drive line of the capacitive sensor with a stimulus frequency and detecting the stimulus frequency with a sense line of the capacitive sensor.

16. The method of claim 15, wherein the drive line is located adjacent to one side of the display area and the sense line is located adjacent to an opposite side of the display area.

17. The method of claim 16, wherein the hover event comprises an object hovering over the display area.

18. A mobile telephone comprising:
a touch screen display configured to display a graphical user interface, the touch screen display having a sensor array operable to recognize touch events and produce signals representative of locations of the touch events on the display; and
a capacitive sensor located separate from and outside a viewing area of the display, the capacitive sensor comprising a sense electrode and a driver electrode located on opposite sides of the viewing area, the capacitive sensor operable to recognize a touch or hover event that occurs over the viewing area and produce a signal representative of the touch or hover event.

* * * * *